United States Patent
Moyer et al.

(10) Patent No.: US 10,742,208 B1
(45) Date of Patent: Aug. 11, 2020

(54) CIRCUIT FOR DRIVING SWITCHED TRANSISTOR AND FILTER, CIRCULATOR AND CORRELATOR INCLUDING THE SAME

(71) Applicant: HRL Laboratories, LLC, Malibu, CA (US)

(72) Inventors: Harris P. Moyer, Los Angeles, CA (US); Jongchan Kang, Moorpark, CA (US); Hasan Sharifi, Agoura Hills, CA (US); Ara K. Kurdoghlian, La Canada, CA (US); James Lazar, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 16/271,725

(22) Filed: Feb. 8, 2019

Related U.S. Application Data

(60) Provisional application No. 62/657,712, filed on Apr. 13, 2018.

(51) Int. Cl.
| | |
|---|---|
| *H03K 17/687* | (2006.01) |
| *H03K 3/356* | (2006.01) |
| *H03K 5/08* | (2006.01) |
| *H03H 11/04* | (2006.01) |
| *H04L 25/03* | (2006.01) |
| *H04B 1/44* | (2006.01) |
| *H01P 1/397* | (2006.01) |
| *H01L 29/778* | (2006.01) |
| *H01L 29/20* | (2006.01) |

(52) U.S. Cl.
CPC ........... *H03K 17/687* (2013.01); *H01P 1/397* (2013.01); *H03H 11/04* (2013.01); *H03K 3/356017* (2013.01); *H03K 5/08* (2013.01); *H04B 1/44* (2013.01); *H04L 25/03834* (2013.01); *H01L 29/2003* (2013.01); *H01L 29/7787* (2013.01)

(58) Field of Classification Search
CPC .. H03K 17/687; H03K 5/08; H03K 3/356017; H03H 11/04; H01L 25/03834; H01L 29/7787; H01P 1/397
USPC .......................................................... 455/83
See application file for complete search history.

(56) References Cited

U.S. PATENT DOCUMENTS

| | | | | |
|---|---|---|---|---|
| 2007/0182448 A1* | 8/2007 | Kwon | ................ | H03K 19/0013 326/68 |
| 2007/0210780 A1* | 9/2007 | Kataoka | ............... | H03K 17/162 323/285 |
| 2016/0344156 A1* | 11/2016 | Rothberg | ............... | H01S 3/1118 |

* cited by examiner

*Primary Examiner* — Eugene Yun
(74) *Attorney, Agent, or Firm* — Ladas & Parry

(57) ABSTRACT

A circuit for driving a switched transistor comprises: a level shifter comprising at least one transistor, the level shifter configured to convert an input pulse to a pulse having a greater voltage swing than the input pulse and shift a voltage level of the converted pulse; and a pulse shaping filter coupled between the level shifter and the gate of the switched transistor, the pulse shaping filter tuned to cancel or reduce an impedance of the gate of the switched transistor. The switched transistor and/or the at least one transistor are a GaN High Electron Mobility Transistor (HEMT).

28 Claims, 13 Drawing Sheets

CIRCUIT FOR DRIVING SWITCHED TRANSISTOR AND FILTER, CIRCULATOR AND CORRELATOR INCLUDING THE SAME

CROSS REFERENCE TO PARENT APPLICATION

This application claims the benefit of U.S. Application No. 62/657,712, filed on Apr. 13, 2018, the disclosure of which is hereby incorporated by reference in its entirety.

STATEMENT REGARDING FEDERALLY SPONSORED RESEARCH OR DEVELOPMENT

This invention was made with support from the United States Government under contract number 201603706-01 awarded by Signal Processing at RF (SPAR) program. The United States Government has certain rights in the invention.

TECHNICAL FIELD

The present disclosure generally relates to a switch circuit comprising a transistor for high power operation. More specifically, some embodiments of the present disclosure relate to a driver circuit for driving a switched transistor for high power operation, such as a GaN High Electron Mobility Transistor (HEMT) switched transistor, and/or to a filter, correlator, circulator and any other circuit including that driver circuit.

BACKGROUND

Various electrical circuits, such as filters, circulators and correlators, employ transistors that are controlled to operate as switches. These circuits typically use switched filter elements as building blocks implemented by silicon Complementary Metal Oxide Semiconductor (CMOS) technologies. However, some CMOS dies may have difficulty in handling power levels greater than 10 mW at high frequencies (e.g. over 100 MHz) without becoming nonlinear or breaking down because CMOS transistors have low breakdown voltages. Accordingly, CMOS transistors may require either extra space for an additional device or a number of stacked devices to avoid breakdown under high drive levels.

Gallium Nitride (GaN) HEMT has attracted attention due to its high-power performance coupled with high breakdown voltage (e.g. over 40V). GaN HEMTs enable to handle high power in switching applications. For high power switching operation of a GaN HEMT, a gate choke resistor is typically used to prevent turning on a Schottky diode of the GaN transistor gate under a high voltage swing of the drain and source of the GaN HEMT. However, such gate choke resistance may cause RC time delay to the gate of the GaN HEMT, collapse a desirable rectangular pulse-shape of the gate control signal, and force to lower the speed of a control signal by a MHz order.

Some conventional GaN filters use benchtop optical line drivers to shift the CMOS voltages, input to the GaN filter, to a level necessary to handle higher input powers (e.g. over 100 mW). However, such optical line drivers may be limited to narrow voltage swings (e.g. 0-6V) and may not allow for adjustment of absolute voltage levels.

Further limitations and disadvantages of conventional and traditional approaches will become apparent to one of skill in the art, through comparison of such systems with some aspects of the present disclosure as set forth in the remainder of the present disclosure.

SUMMARY

The features and advantages of the present disclosure will be more readily understood and apparent from the following detailed description, which should be read in conjunction with the accompanying drawings, and from the claims which are appended to the end of the detailed description.

According to various embodiments of the present disclosure, a circuit for driving a switched transistor may comprise: a level shifter comprising at least one transistor, the level shifter configured to convert an input pulse to a pulse having a greater voltage swing than the input pulse and shift a voltage level of the converted pulse; and a pulse shaping filter coupled between the level shifter and the gate of the switched transistor, the pulse shaping filter tuned to reduce a pulse shape change by the switched transistor on the gate of the switched transistor and configured to maintain a shape of the level shifted pulse on the gate of the switched transistor. According to some embodiments of the present disclosure, the pulse shaping filter may be configured to reduce or cancel an impedance of the switched transistor. According to certain embodiments of the present disclosure, the switched transistor and/or the at least one transistor may be a GaN High Electron Mobility Transistor (HEMT).

According to some embodiments of the present disclosure, a multi-element switched filter may comprise: a plurality of switched transistors; and a plurality of the circuits for driving the switched transistor described above, each of the circuits coupled to a gate of a respective one of the switched transistors. The plurality of switched transistors and/or at least one transistor included in the circuits can be GaN HEMTs.

According to certain embodiments of the present disclosure, a multi-path bandpass filter may comprise: a plurality of switched transistors; a plurality of the pulse shaping filters, each of the pulse shaping filters coupled to a gate of a respective one of the switched transistors; and a plurality of the level shifters, each of the level shifters coupled to at least one of the pulse shaping filters. Each of the level shifters may be coupled to at least two of the pulse shaping filters which have the same time delay of the input pulse. According to certain embodiments of the present disclosure, the plurality of switched transistors and/or at least one transistor included in the level shifters may be GaN HEMTs.

According to various embodiment of the present disclosure, a multi-path bandpass filter may comprise: a plurality of switched transistors; a plurality of the pulse shaping filters, each of the pulse shaping filters coupled to a gate of a respective one of the switched transistors; one level shifter; a plurality of delay circuits coupled to the level shifter, the delay circuits configured to time delay the level shifted pulse, each of the delay circuits coupled to one or more of the pulse shaping filters. According to certain embodiments of the present disclosure, the plurality of switched transistors and/or at least one transistor included in the level shifter may be GaN HEMTs.

According to some embodiments of the present disclosure, a circulator may comprise the multi-path bandpass filter; a transmitter; a receiver; an antenna; and first, second and third phase transformers configured to provide phase shift, wherein the first phase transformer is coupled between the transmitter and the antenna, the second phase transformer and the multi-path band pass filter are coupled between the transmitter and the receiver, and the third phase transformer is coupled between the antenna and the receiver. The multi-path bandpass filter may be configured to provide a positive phase shift from the transmitter to the receiver and a negative phase shift from the receiver to the transmitter.

A better understanding of the nature and advantages of the present disclosure may be gained with reference to the detailed description and the drawings below.

BRIEF DESCRIPTION OF THE DRAWINGS

Various embodiments in accordance with the present disclosure will be described with reference to the drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the invention. The following detailed description is, therefore, not to be taken in a limiting sense, and the scope of the invention is defined only by the appended claims and equivalents thereof. Like numbers in the figures refer to like components, which should be apparent from the context of use.

Figure 1:
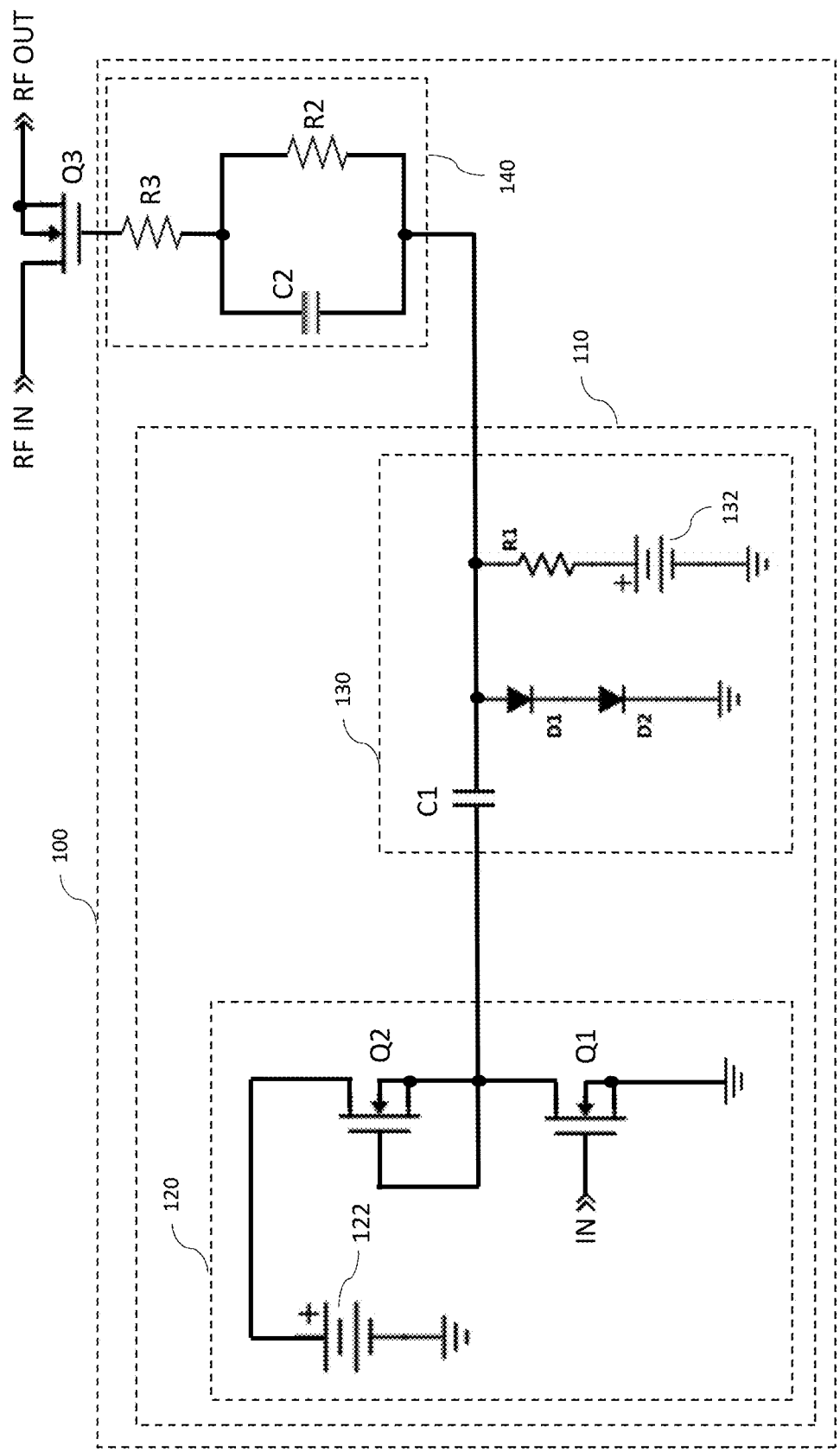
FIG. 1 illustrates a schematic diagram of a circuit for driving a switched transistor in accordance with an embodiment of the present disclosure.

FIG. 1 illustrates a schematic diagram of a circuit for driving a switched transistor in accordance with an embodiment of the present disclosure. A circuit 100 may comprise a level shifter 110 and a pulse shaping filter 140. In the illustrated embodiment, the switched transistor is a GaN HEMT. Other embodiments can use other transistors.

The circuit 100 may be configured to provide proper voltage levels on a GaN HEMT switched transistor Q3 to handle high levels of power (e.g. over 100 mW), and a fast enough switching time so that the switched transistor Q3 can operate at frequencies up to 1 GHz. The circuit 100 may be able to provide over 8V voltage swing at the gate of the switched GaN HEMT transistor Q3 for high power operation, for example, but not limited to, a voltage swing of +1V to −7V.

An input circuit of the level shifter 110 may be, for example, but not limited to, an inverting circuit 120. The inverting circuit 120 may be configured to invert an input pulse and increase the voltage swing of the input pulse. The inverting circuit 120 may comprise one or more GaN HEMT transistors or any transistors that can increase the voltage swing of a input pulse. In the exemplary embodiment of FIG. 1, the inverting circuit 120 includes a first GaN HEMT transistor Q1 and a second GaN HEMT transistor Q2. For example, the transistors Q1 and Q2 may be N channel type depletion mode GaN HEMT transistors. The first transistor Q1 may act as a driver and the second transistor Q2 may act as a load. The first transistor Q1 is an input transistor, having the gate of the first transistor Q1 connected to an input terminal IN for receiving the input pulse, the source of the first transistor Q1 grounded, and the drain of the first transistor Q1 coupled to an input of a level shifting circuit 130, and to the gate and source of the second transistor Q2. The drain of the second transistor Q2 is connected to a voltage rail source 122. In the exemplary embodiment, the voltage rail is set to 12V.

Figure 3:
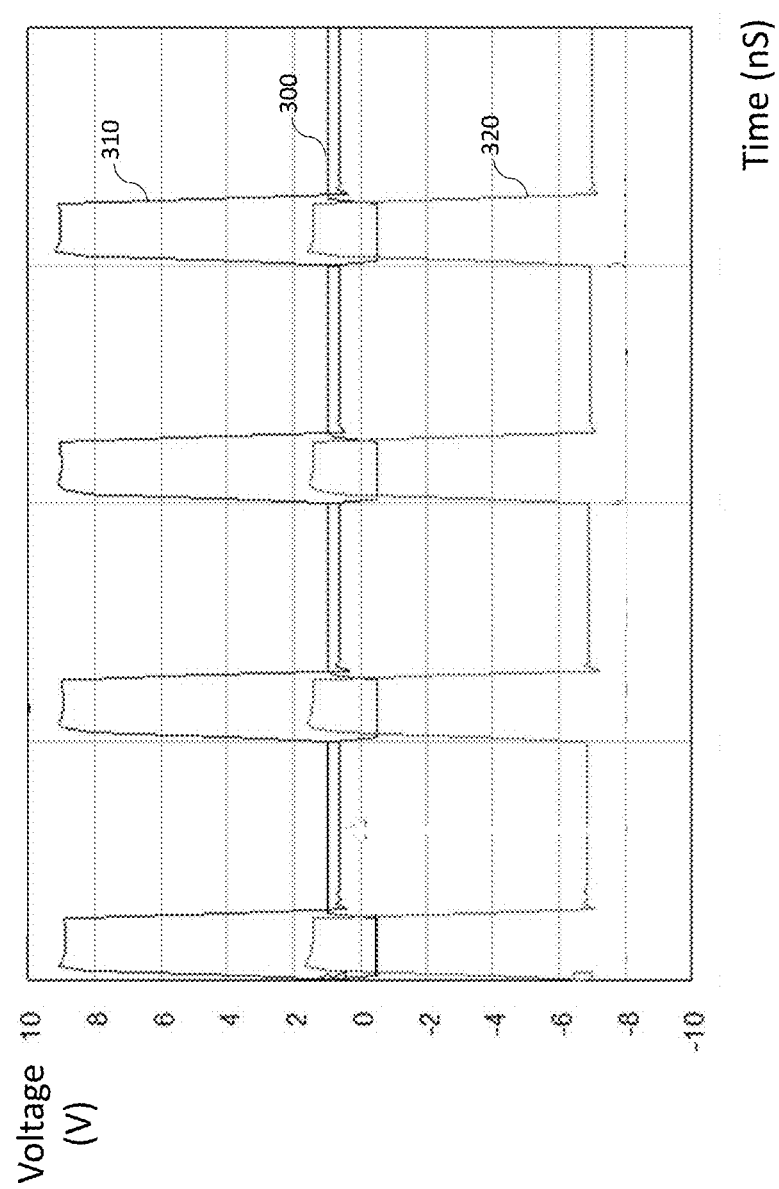
FIG. 3 shows an input pulse received by a level shifter, a pulse converted by an inverting circuit, and an output pulse provide at a gate of a switched transistor.

In operation, an input pulse can be input to the gate of the first GaN HEMT transistor Q1 and a pulse related to the input pulse is outputted from the drain of the first transistor Q1 to the level shifting circuit 130. The GaN HEMT transistors Q1 and Q2 forming an inverter inverts the input pulse as well as increases the voltage swing of the input signal. Voltage swing may be increased by adopting GaN HEMTs, especially with cascode configuration. The second transistor Q2 may enable to maximize the signal swing of the input pulse. The GaN HEMTs may allow a larger voltage swings on the drain than other RF power semiconductor technologies. The circuit 100 may be driven by a CMOS Application Specific Integrated Circuit (ASIC) or a standard CMOS Field Programmable Gate Arrays (FPGA). For example, the input pulse can be an inverted CMOS pulse having a low voltage level (e.g. 0V to −1V), and the inverting circuit 120 can convert the 0V to −1V inverted CMOS pulse to a 0V to 10V pulse. FIG. 3 shows examples of an input pulse 300 received at the gate of the first transistor Q1 and a pulse 310 converted by the inverting circuit 120.

The level shifting circuit 130 may be configured to shift the voltage level of the pulse converted by the GaN HEMT inverting circuit 120. For example, the level shifting circuit 130 may be implemented by using a Resistor-Capacitor (RC) filter, such as a RC high-pass filter pulling the DC level of its input signal to a desired voltage. In the exemplary embodiment, the level shifting circuit 130 may comprise a first capacitor C1 and a first resistor R1.

The first capacitor C1 may be coupled to the inverting circuit 120. The first capacitor C1 may be configured to shift the voltage level of the pulse converted by the inverting circuit 120. For example, the 0V to 10V pulse output from the inverting circuit 120 may be fallen toward negative by the first capacitor C1. The capacitance of the first capacitor C1 may be set to a high enough value to minimize the attenuation at the frequency of interest (i.e., an RF short). For example, the first capacitor C1 may be implemented, in one example, as a 30 pF capacitor.

The first resistor R1 and a gate bias source 132 may be arranged such that a first electrode of resistor R1 is connected between the first capacitor C1 and a pulse shaping filter 140; and that a second electrode of first resistor R1 is connected to the gate bias source 132 so as to provide a bias voltage that further shifts the level of the pulse that is level-shifted by the first capacitor C1. A pulse passed through the first capacitor C1 is biased by the gate bias source 132 using the first resistor R1. For example, when the bias voltage of the gate bias source 132 is set to −2.5V, the pulse level-shifted by the first capacitor C1 may be pulled further negative by the negative gate bias source 132.

Figure 2:
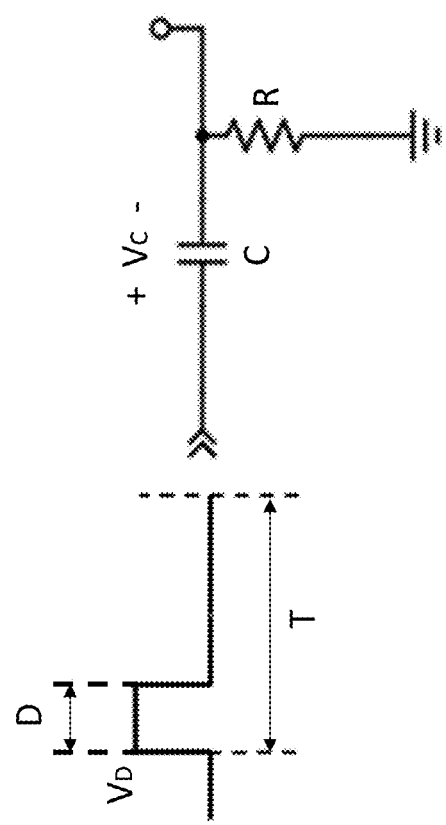
FIG. 2 shows an example of simple RC high pass filter circuit.

The duty cycle of the input pulse may affect voltage shift down in the level shifting circuit 130. When the simple RC high pass filter circuit illustrated in FIG. 2 is excited by a square wave pulse, the pulse may be shifted down and the average voltage drop across a capacitor C may be related to the duty cycle of the pulse as expressed in Equation (1):

$$Vc = Vp * D \quad (1)$$

where Vc is the voltage of the capacitor C, Vp is the voltage of the pulse, and D is the duty cycle of the pulse.

The governing equations are detailed below and are based on the principle that there is zero average displacement current through a capacitor over the period of a pulse as in Equation (2).

$$\int_0^T i_c dt = 0 \quad (2)$$

where $i_c$ is a current through the capacitor.

Assuming an ideal pulse, Equation (2) can be used to obtain Equation (3). Equation (3) leads to Equation (4), and Equation (4) leads to Equation (5).

$$\int_0^T i_c dt = \int_0^{DT} i_c dt + \int_{DT}^T i_c dt = 0 \quad (3)$$

$$(V_P - V_C) * D + (-V_C)(1 - D) = 0 \quad (4)$$

$$V_C = V_P * D \quad (5)$$

where $i_c$ is a current through the capacitor, T is a whole clock cycle of a pulse, D is the duty cycle of a pulse, Vc is the voltage of the capacitor C, and Vp is the voltage of a pulse.

Equation (5) explains that the voltage across the capacitor Vc is negative for a portion of the cycle for the currents to balance to zero. Accordingly, Equation (5) shows that the average voltage drop Vc across the capacitor is related to the duty cycle D of the pulse and the duty cycle D of the pulse may significantly affect the voltage level shift of the pulse inputted to the capacitor. In the exemplary embodiment, the preferred duty cycle of the input pulse may be 25% for the targeted voltage shift of the level shifter 130.

Optionally, the level shifter 130 may further comprise one or more diodes. In the exemplary embodiment, the voltage level shift circuit 120 may comprise a first diode D1 and a second diode D2. The diodes D1 and D2 may be coupled to the first capacitor C1 and/or the first resistor R1. The diodes D1 and D2 are optional elements and may be needed depending on the maximum turn-on voltage for the switched transistor Q3. The diodes D1 and D2 may be configured to clamp the high drive level of the voltage pulse provided to the gate of the switched transistor Q3. In the exemplary embodiment, the diodes D1 and D2 clamp the positive voltage level of the level shifted pulse, such as 1V. For example, the diodes D1 and D2 pin the node 134 to 1V. This may set the maximum voltage of the pulse inputted to the pulse shaping filter 140. When 1 GHz is the nominal frequency of operation and the pulse width is 0.25 nS which is equivalent to a 25% duty cycle, the output of the level shifter 130 without the diodes D1 and D2 may range from −2.5 to 6 V. However, the diodes D1 and D2 limit the positive voltage of the output of the level shifter 130 to 1V. Because the positive level of the output of the level shifter 130 is reduced by 5V from 6V to 1V by the diodes D1 and D2, the negative level of the output of the level shifter 130 is adjusted as well down by 5V from −2.5V to −7V by the. This change may occur because of the pulse shaping filter 140 and the transistor Q3 in parallel with the first resistor R1 and the −2.5V gate bias source 132.

The pulse shaping filter 140 may be coupled between the level shifter 110 and the switched transistor Q3. The pulse shaping filter 140 may be tuned to reduce a pulse shape change, such as a change to an edge of a pulse, by the switched transistor Q3 and be configured to maintain the shape of the level-shifted pulse on the gate of the GaN HEMT switched transistor Q3. The GaN HEMT transistor may have RC input, such as, an input impedance which is an impedance from the gate to the source. This input impedance of the transistor may alter the shape of an incident pulse. Accordingly, if the GaN HEMT level shifter 110 is directly connected to the switched transistor Q3 without the pulse shaping filter 140, the RC input of the switched transistor Q3 may change the pulse shape of the output pulse of the level shifter 110. For example, the RC input of the switched transistor Q3 may change a square edge pulse to a sloped pulse. The pulse shaping filter 140 may be tuned to resonate with the RC input of the switched transistor Q3 to maintain the pulse integrity, for example, but not limited to, the pulse shape desired for the filter frequency and the number of elements in the filter bank. For example, the pulse shaping filter 140 may be tuned to cancel the reactive (or capacitive) component of the input impedance of the switched transistor Q3. The pulse shaping filter 140 may be tuned so that the impedance combining the input impedance of the switched transistor Q3, which may be a parallel RC, with the impedance of the parallel circuit of a second capacitor C2 and the second resistor R2 of the pulse shaping filter 140 can be minimized, for example, zero. The pulse shaping filter 140 may provide an impedance which cancels the reactive part of the input impedance of the switched transistor Q3 (which may be, for example, but not limited to, a parallel RC equivalent circuit) by setting the values of the second capacitor C2 and the resistor R2 along with the resistor R3 so that the incoming pulse only sees a resistance. While the resistive value formed by the combination of the pulse shaping filter 140 and the RC input of the switched transistor Q3 may slightly degrade the amplitude of the pulse on the gate of the switched transistor Q3, the shape of pulse edges of the pulse inputted to the pulse shaping filter 140 may be maintained on the gate of the switched transistor Q3. Accordingly, the pulse shaping filter 140 may provide proper amplitude and clean pulse signal transfer to the gate of the switched transistor Q3 as well as effectively deliver the shape and amplitude of the square wave pulse to the gate of the switched transistor Q3 and enable high power switching operation of the switched transistor Q3.

The pulse shaping filter 140 may comprise the second capacitor C2, the second resistor R2, and a third resistor R3. In the exemplary embodiment, the second capacitor C2 and the second resistor R2 may be connected in parallel and coupled to the third resistor R3. The third resistor R3 is connected to the gate of the switched transistor Q3.

The second resistor R2 may have a high resistance enough to limit the Direct Current (DC) current into the gate of the switched transistor Q3 when the input Schottky diodes of the switched transistor Q3 start to forward bias. This forward biasing may occur under high drive levels when the switched transistor Q3 is turned on. The resistance of the second resistor R2 may be, for example, but not limited to, between 5 and 10 kΩ.

The second capacitor C2 may be used in combination with the second and third resistors R2 and R3 and the input capacitance of the switched transistor Q3 to maintain the shape of the incident pulse on the gate of the switched transistor Q3. The capacitance of the second capacitor C2 may be, for example, but not limited to, between 0.1 and 0.2 pF, and the resistance of the third resistor R3 may be, for example, but not limited to, between 50 and 100 Ω.

If the circuit 100 does not include the parallel circuit of the second resistor R2 and the second capacitor C2, pulse integrity may be maintained but power handling may be reduced at a minimum by a factor of 10.

The gate of the switched transistor Q3 may be connected to the pulse shaping filter 140. For instance, the resistor R3 of the pulse shaping filter 140 may be coupled to the gate of the switched transistor Q3. The switched transistor Q3 may be excited by square wave pulses. In the exemplary embodiment, the pulse shaping filter 140 may delivers a −7 to 1.4 V output pulse 320 to the gate of the switched transistor Q3 as shown in FIG. 3.

The switched transistor Q3 may be, for example, but not limited to, a filter element which may be used in a bandpass filter, circulator, correlator or any circuit common in radio frequency (RF) front ends. The switched transistor Q3 is implemented as the GaN HEMT.

Table 1 below provides exemplary values for the capacitors C1 and C2, the resistors R1-R3 and the GaN HEMT switched transistors Q1-Q3. The circuit 100 having the values listed in Table 1 can be used as an element in a filter, circulator or correlator operating at 1 GHz. The particular values may be varied to meet the design criteria of a particular implementation. Specifically, the values can be changed to adjust a voltage output and/or to operate at specific frequencies at specific voltage levels. For instance, to operate at other frequencies, the capacitance of the capacitor C1 and/or C2 may be changed. Therefore, the circuit 100 according to some embodiments of the present disclosure can be designed to provide specific required voltage levels and/or to adjust an operating frequency for high power operation.

TABLE 1

| Component | Value |
| --- | --- |
| Q1 | 12 × 50 μm |
| Q2 | 12 × 50 μm |
| C1 | 30 pF |
| R1 | 20 kΩ |
| C2 | 0.2 pF |
| R2 | 8 kΩ |
| R3 | 50 Ω |
| Q3 | 6 × 50 μm |

In some embodiments, the GaN HEMT level shifter 110 and/or the pulse shaping filter 140 of FIG. 1 as well as a circulator, correlator or filter may be integrated on the same die, such as a single GaN Monolithic Microwave Integrated Circuit (MMIC) die. Therefore, certain embodiments of the present disclosure can be more compact than conventional technologies using external sources and may eliminate the need for a large external equipment to generate switch sources. Additionally, according to some embodiments, the die may be designed for different voltage levels and frequencies of operation.

Accordingly, certain embodiments of the circuit 100 may achieve high voltage swings while maintaining narrow, well-shaped pulses by including the GaN HEMT inverting level shifter 100 and the RC filter 140.

Figure 4:
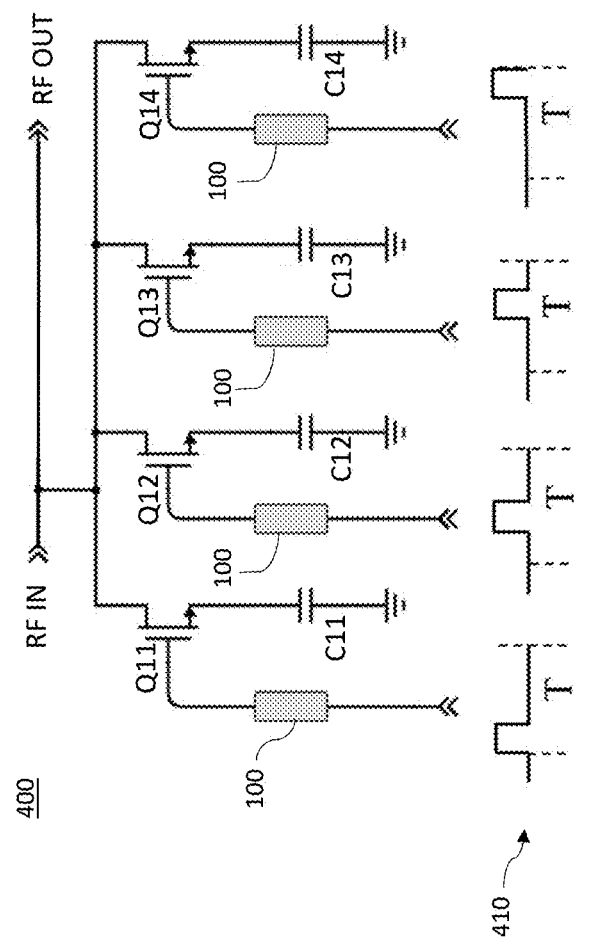
FIG. 4 shows a schematic diagram of a four element shunt switched filter circuit according to an exemplary embodiment of the present disclosure.

The circuit 100 shown in FIG. 1 can be applied for a multi-element shunt switched filter circuit. FIG. 4 shows an exemplary embodiment of a four element shunt switched filter circuit.

A four element shunt (or parallel) switched filter circuit 400 may comprise a first GaN HEMT switched transistor Q11, a second GaN HEMT switched transistor Q12, a third GaN HEMT switched transistor Q13 and a fourth GaN HEMT switched transistor Q14 which are connected in parallel. For example, The GaN HEMT switched transistors Q11-Q14 may be implemented as 6×50 μm GaN HEMT and their center frequencies may be 1 GHz. Each source of the switched transistors Q11-Q14 may be connected to a respective one of capacitors C11-C14. The circuit 100 of FIG. 1 may be coupled to the gate of a respective one of the GaN HEMT switched transistors Q11-Q14 to drive the switched transistors Q11-Q14. The order of excitation is indicated as 410 under each circuit 100 and the width of each individual input pulse is, for example, but not limited to, 0.25 nS which represents one quarter of the frequency period (T is 1 nS for 1 GHz). The filter circuit 400 may further comprise a transmission line 405 between an RF input port RF IN and an RF output port RF OUT. For example, the transmission line 405 may be a transmission line having a short length and physically distinguished from the ports RF IN and RF OUT and need for simulating the filter circuit 400.

Figure 5:
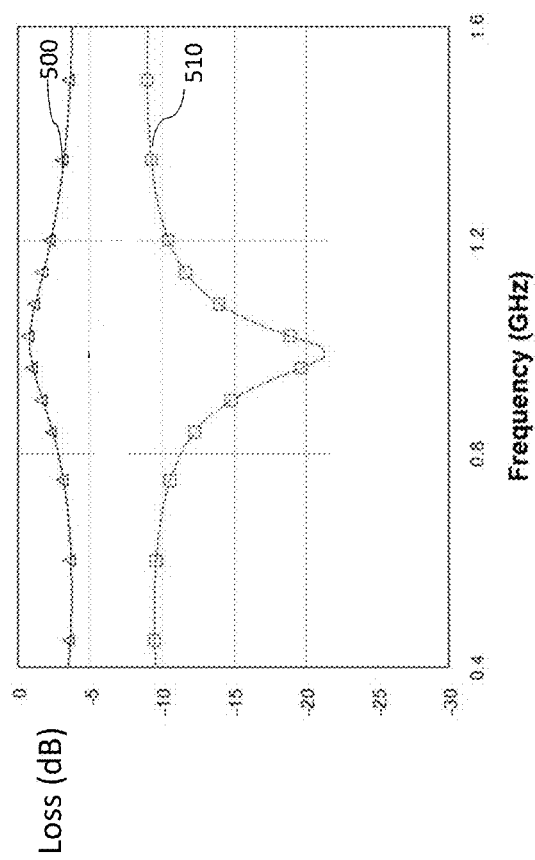
FIG. 5 shows graphs of simulated outputs of the four element shunt switched filter operated at a center frequency of 1 GHz according to an exemplary embodiment of the present disclosure.

FIG. 5 shows graphs of simulated outputs of the four element shunt switched filter 400 operated at the center frequency of 1 GHz. A upper line 500 shows insertion loss and a lower line 510 shows return loss. As shown in FIG. 5, the four element shunt switched filter 400 has 0.76 dB insertion loss and around 20 dB return loss at the 1 GHz center frequency. Although FIG. 4 illustrates a four element shunt switched filter circuit, filter response can be made sharper by adding more shunt elements to the four element shunt switched filter 400.

Figure 6A:
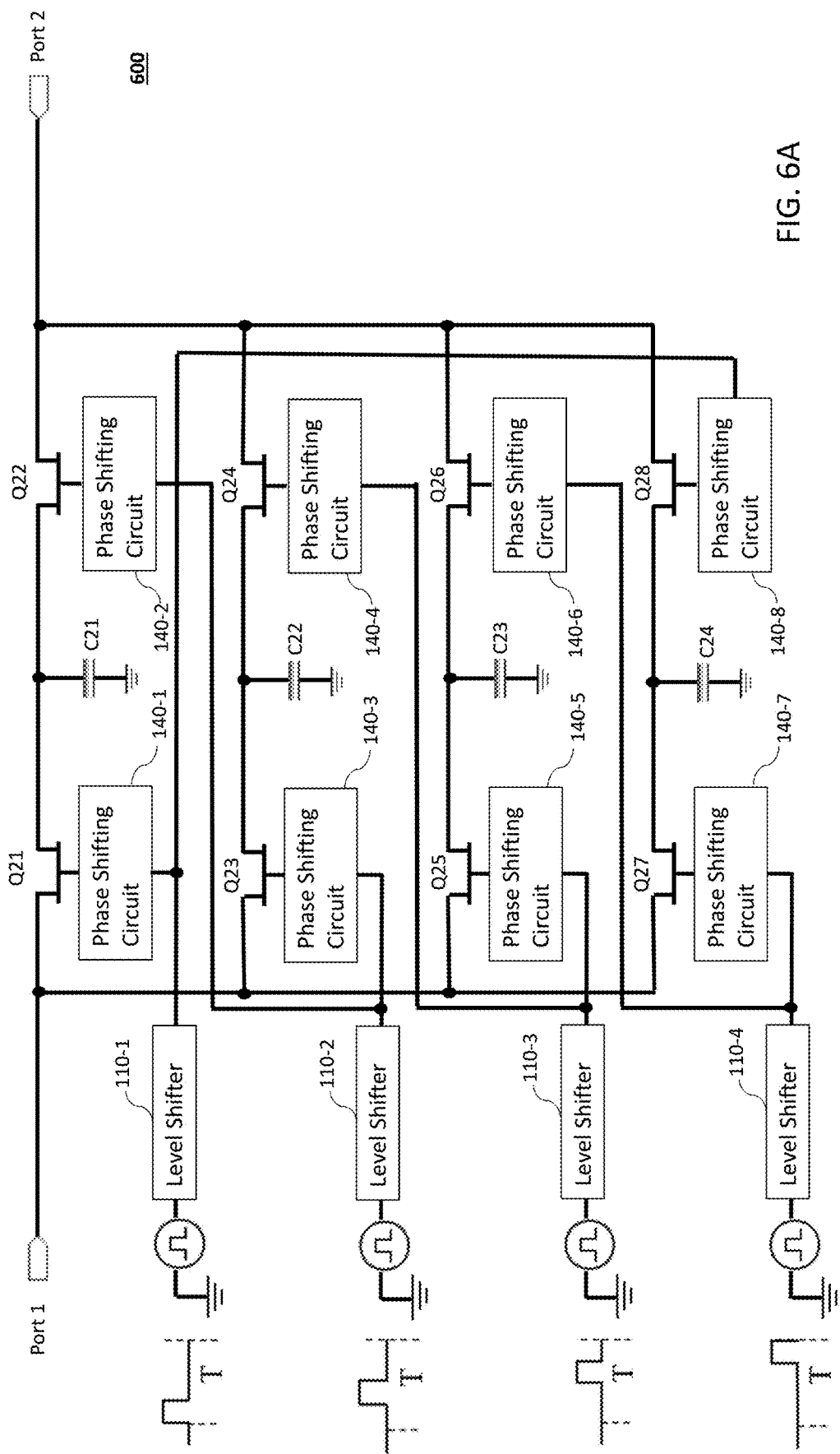
FIGS. 6A-6C show schematic diagrams of a high-power operating non-reciprocal 4-path bandpass filter according to exemplary embodiments of the present disclosure.
Figure 6B:
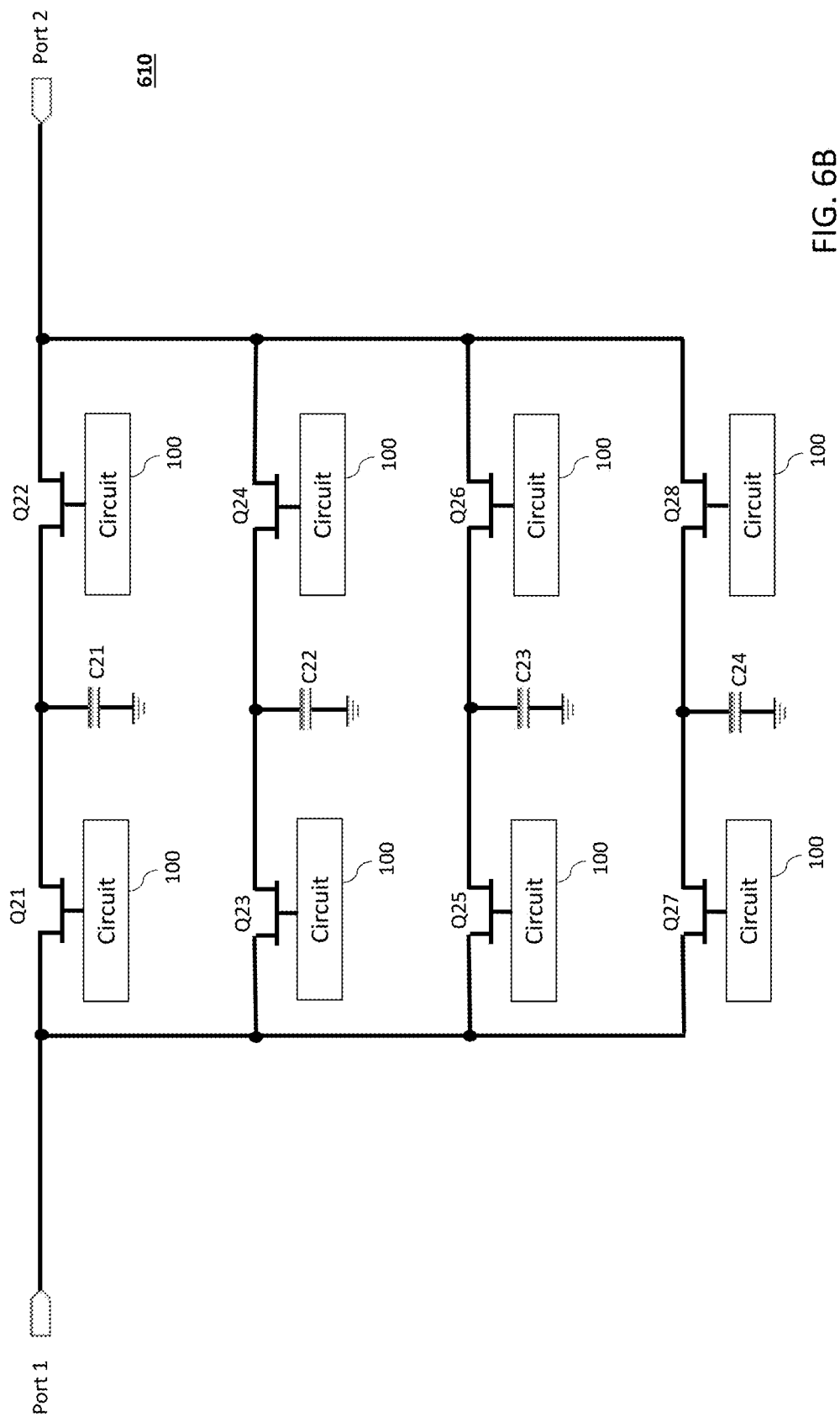
Figure 6C:
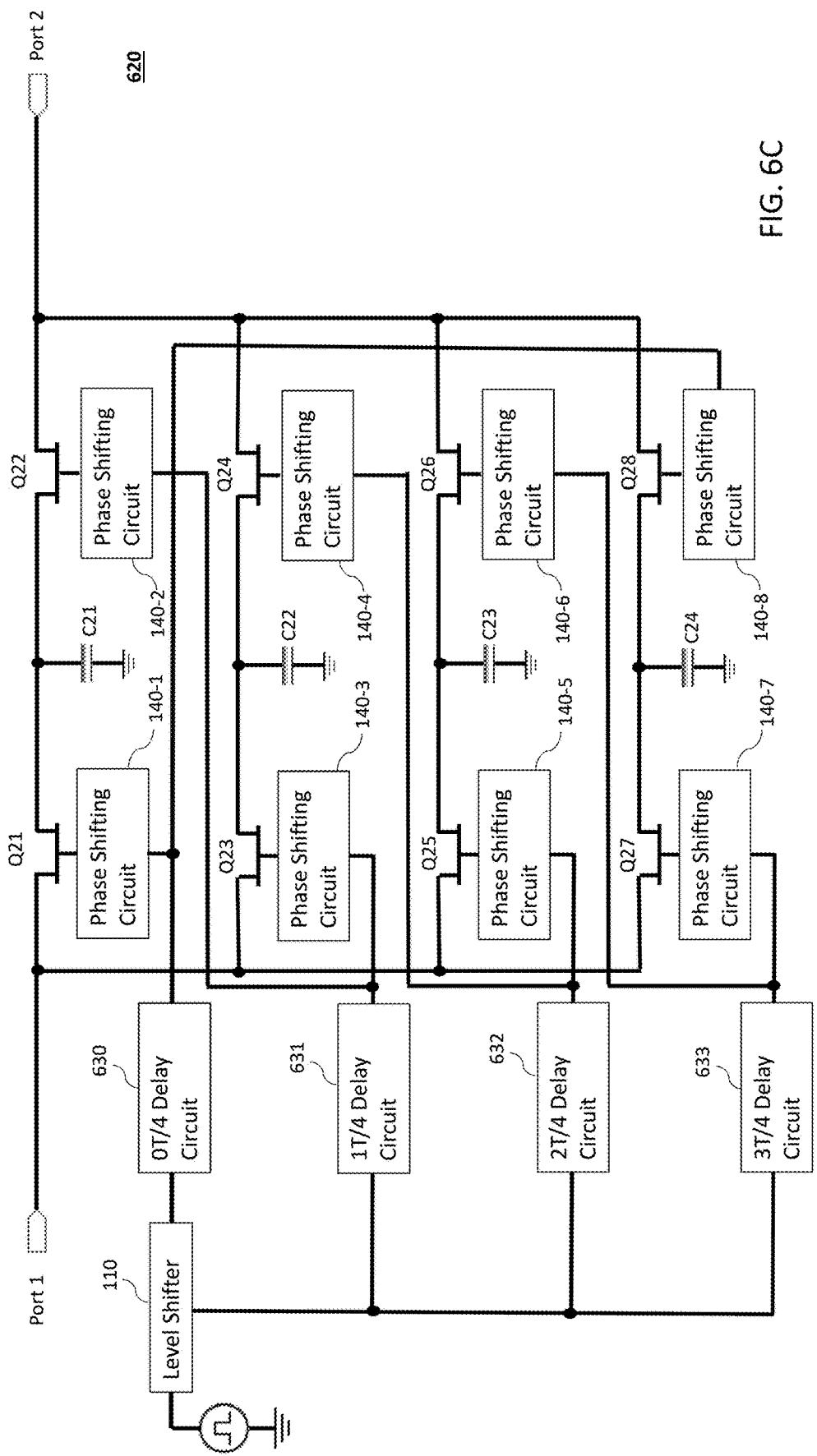

The circuit 100, the level shifter 120 and the pulse shaping filter 130 of FIG. 1 can be applied for a non-reciprocal multi-path bandpass filter for high power operation. FIGS. 6A-6C show exemplary embodiments of a high-power operating non-reciprocal 4-path bandpass filter.

Four external pulse signals may drive four GaN HEMT level shifters 110-1, 110-2, 110-3 and 110-4 with T/4 time delay one by one. For example, the external pulse signals are signals having CMOS based low voltage peak to peak amplitude and 25% duty-cycle. For high power operation, the non-reciprocal 4-path bandpass filter 600 may adopt the GaN HEMT inverting level shifter 110 of FIG. 1. The first to fourth GaN HEMT level shifters 110-1 to 110-4 are the GaN HEMT level shifter 110 shown in FIG. 1.

In an exemplary embodiment of FIG. 6A, each one of the first to fourth GaN HEMT level shifters 110-1 to 110-4 drives respective two of pulse shaping filters 140-1 to 140-8 with the same delay. For example, the first GaN HEMT level shifter 110-1 is coupled to a first phase shaping filter 140-1 as well as an eighth phase shaping filter 140-8, the second GaN HEMT level shifter 110-2 is coupled to second and third phase shaping filters 140-2 and 140-3, the third GaN HEMT level shifter 110-3 is coupled to fourth and fifth phase shaping filters 140-4 and 140-5, and the fourth GaN HEMT level shifter 110-4 is coupled to sixth and seventh phase shaping filters 140-6 and 140-7.

In another embodiment of FIG. 6B, one full set of the circuit 100 of FIG. 1 can be coupled to the gate of each switched transistors Q21-Q28 instead of coupling one GaN HEMT level shifter to two phase filters. However, the filter 600 according to the exemplary embodiment of FIG. 6A may avoid circuit complexity and save DC power consumption when compared to the filter 610 of the exemplary embodiment of FIG. 6B.

Alternatively, as shown in FIG. 6C, one GaN HEMT level shifter 110 of FIG. 1 can drive eight switched transistors Q21-Q28 by adding 0T/4, 1T/4, 2T/4 and 3T/4 delay circuits 630, 631, 632 and 633, for example, but not limited to, phase shifters. The first delay circuit 630 may be configured to time delay the pulse output from the GaN HEMT level shifter 110 by 0T/4, the second delay circuit 631 may be configured to time delay the pulse output from the GaN HEMT level shifter 110 by 1T/4, the third delay circuit 632 may be configured to time delay the pulse output from the GaN HEMT level shifter 110 by 2T/4, and the fourth delay circuit 633 may be configured to time delay the pulse output from the GaN HEMT level shifter 110 by 3T/4. Each of the delay circuits 630-633 is coupled to respective two of phase shifting circuits 140-1 to 140-8 which have the same time delay.

The non-reciprocal 4-path bandpass filters 600, 610 and 620 may comprise four shunt capacitors C21-C24. In the exemplary embodiment, the first shunt capacitor C21 is coupled between the first and second switched transistors Q21 and Q22, the second shunt capacitor C22 is coupled between the third and fourth switched transistors Q23 and Q24, the third shunt capacitor C23 is coupled between the fifth and sixth switched transistors Q25 and Q26, and the fourth shunt capacitor C24 is coupled between the third and fourth switched transistors Q27 and Q28.

In order to make a circulator compatible the non-reciprocal 4-path bandpass filter 600, 610 or 620, the phase shifting between S12 (from a Port 1 to a Port 2) and S21 (from the Port 2 to the Port 1) may be 180 degree out of phase (90 degree, −90 degree) at an interesting frequency and the values of the shunt capacitors C21-C24 may be tuned. For example, by implementing the switched transistors Q21-28 and the shunt capacitors C21-C24 as 6×120 μm GaN HEMTs and 8 pF capacitors, the multi-path bandpass filters 600, 610 and 620 may have 180 degree out of phase between S21 and S21 under 1 GHz T/4 delayed pulse signal driving.

Figure 7:
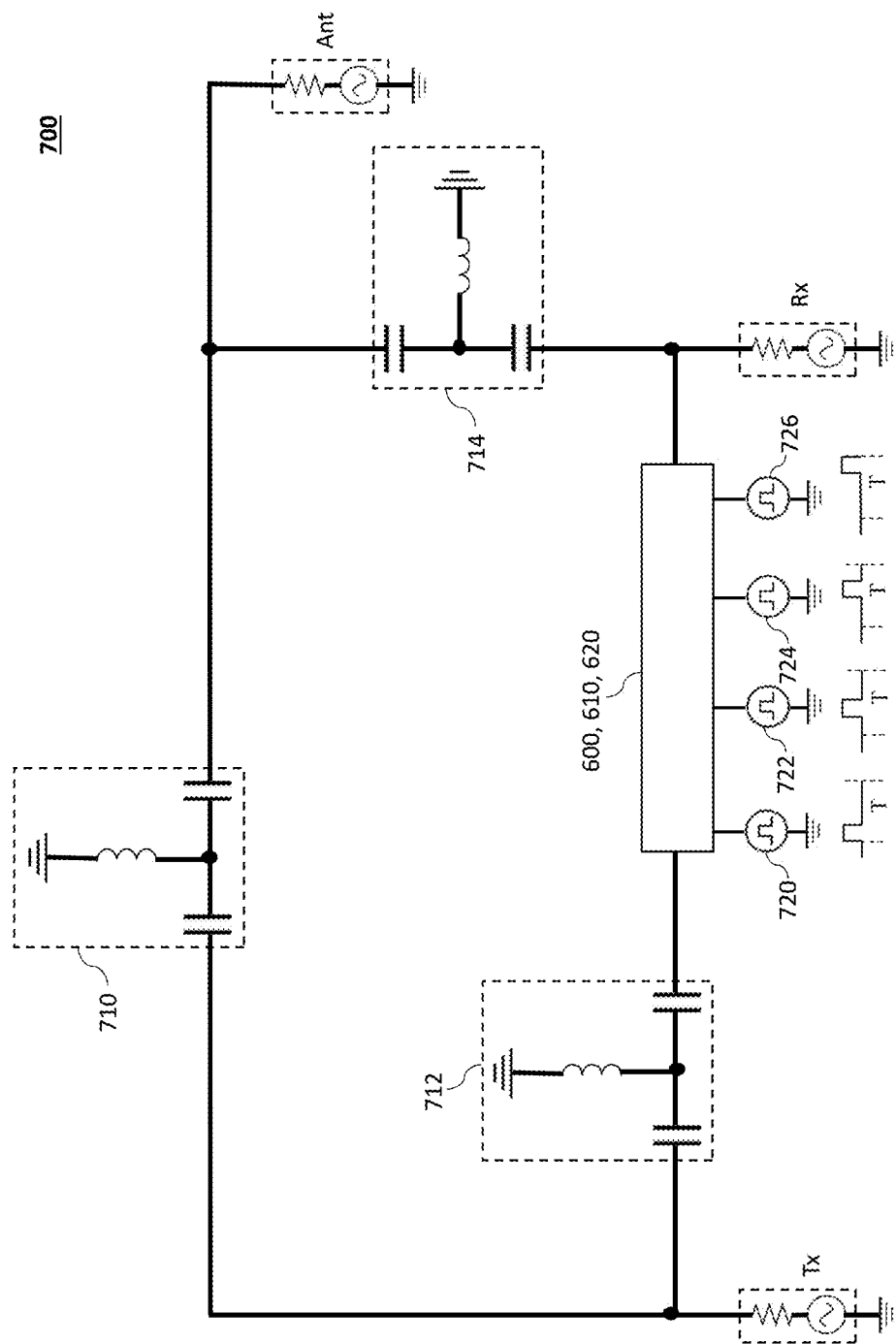
FIG. 7 shows a schematic diagram of a circulator implemented using a non-reciprocal 4-path bandpass filter of FIGS. 6A-6C according to an embodiment of the present disclosure.

The multi-path bandpass filters 600, 610 and 620 of FIGS. 6A-6C can be applied for a high power circulator. FIG. 7 shows an exemplary embodiment of a circulator implemented using the non-reciprocal 4-path bandpass filter of FIGS. 6A-6C.

One of the non-reciprocal multi-path bandpass filters 600, 610 and 620 shown in FIGS. 6A-6C can be used in a circulator 700. Clock sources 720, 722, 724 and 726 may be configured to generate and provide pulse signals with T/4 delay to the non-reciprocal 4-path bandpass filter 600, 610 or 620. For example, for 1 GHz circulator implementation, the clock sources 720, 722, 724 and 726 generate 1 GHz pulse signals with 25% duty cycle. The non-reciprocal 4-path bandpass filter 600, 610 or 620 may provide a positive 90° phase shift from a transmitter Tx to a receiver Rx and a negative 90° phase shift from the receiver Rx to the transmitter Tx with properly T/4 delayed switched pulse signals as shown in FIG. 7. In the exemplary embodiment, the Port 1 of the non-reciprocal multi-path bandpass filters 600, 610 and 620 is connected to a second quarter wave transformer 712 and the Port 2 of the non-reciprocal multi-path bandpass filters 600, 610 and 620 is connected to a third quarter wave transformer 714 and the receiver Rx.

Quarter wave (λ/4) transformers 710, 712 and 714 may be configured to provide a negative 90° phase shift. Circulator action may be achieved around the loop of the circulator 700 where the circulator phase shift is added with the phase shift of the quarter wave transformers 710, 712 and 714.

As illustrated in FIG. 7, each of the negative shift quarter wave transformers 710, 712 and 714 may comprises two capacitors and one inductor in a T configuration. The capacitors may be connected in series to each other and the inductor may have an end connected between the capacitors and the other end grounded. For example, the capacitors may be implemented, in one example, as a 30 pF capacitor. To make −90° phase shifting for 1 GHz signal providing 500 reference impedance, the capacitance of the capacitors may be up to 3.2 pF and the inductance of the inductor may be 8.2 nH. Although FIG. 7 illustrates the quarter wave transformers 710, 712 and 714 as a lumped element based high-pass filter quarter wave transformer (λ/4), the quarter wave transformers 710, 712 and 714 can be implemented as other types of transformers that can provide an appropriate phase shift, for example, but not limited to, low-pass type transformers or micro-strip based transformers.

The first quarter wave transformer 710 is coupled between the transmitter Tx and the antenna Ant. The second quarter wave transformer 712 is coupled between the transmitter Tx and the non-reciprocal 4-path bandpass filter 600, 610 or 620. The third quarter wave transformer 714 is coupled between the antenna Ant and the receiver Rx.

A signal from the transmitter Tx may exit from the antenna Ant and add destructively with another Tx signal through the non-reciprocal 4-path bandpass filter 600, 610 or 620 at the receiver Rx. Therefore, by using the non-reciprocal 4-path bandpass filter 600, 610 or 620, high isolation from the transmitter Tx to the receiver Rx and the low-loss from the transmitter Tx to the antenna Ant may be achieved. Similarly, a signal from the antenna Ant may be constructively added at the receiver Rx and destructively with another Ant signal through the non-reciprocal 4-path bandpass filter 600, 610 or 620 at the transmitter Tx. Accordingly, by using the non-reciprocal 4-path bandpass filter 600, 610 or 620, high isolation from the antenna Ant to the transmitter Tx and the low-loss from the antenna Ant to the receiver Rx may be achieved.

Figure 8:
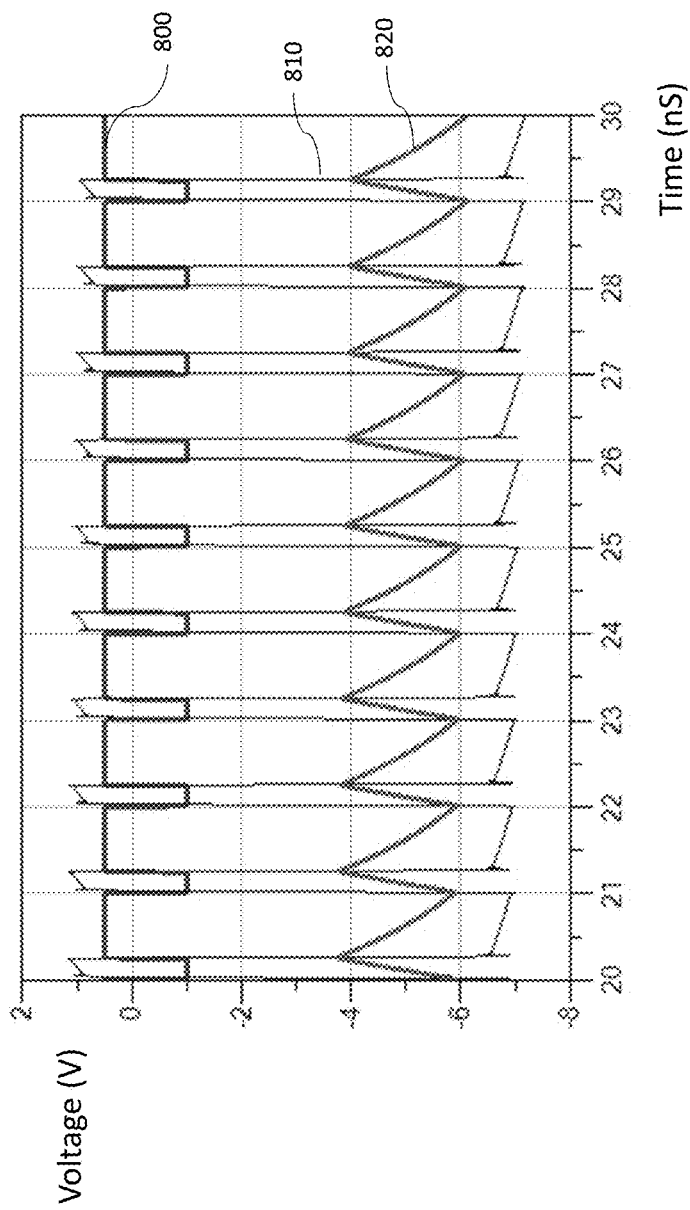
FIG. 8 illustrates simulated time domain waveforms for a circulator operating at 1 GHz.

FIG. 8 illustrates simulated time domain waveforms of the circulator 700 of FIG. 7 operating at 1 GHz. An input waveform 800 shows the −1V to 0.5V pulse input to the non-reciprocal 4-path bandpass filters 600, 610 and 620. A functional waveform 810 shows the −7V to 1.4V pulse at the gate of the GaN HEMT switched transistor of FIG. 6A-6C included in the non-reciprocal 4-path bandpass filters 600, 610 and 620. A waveform 820 shows a pulse at the gate of the GaN HEMT switched transistor of FIGS. 6A-6C in the case where each of the phase shifting circuits 140-1 to 140-8 is replaced with a single 3 kΩ resistor in series with the gate of the GaN HEMT switched transistor in FIGS. 6A-6C.

When compared with the waveform 820, the waveform 810 shows the efficacy of including the phase shifting circuits 140-1 to 140-8 and that the phase shifting circuits 140-1 to 140-8 enable the circulator 700 to perform as a circulator and allow for the handling of higher power levels. Such overall simulation results of FIG. 8 demonstrate that the circuit 100 disclosed in FIG. 1 enables high power operation of the non-reciprocal bandpass filters 600, 610 and 620 and the circulator 700. Accordingly, by using the circuit 100 of FIG. 1, power handling capability of the high-speed filter, circulator and correlator may be increased.

Figure 9A:
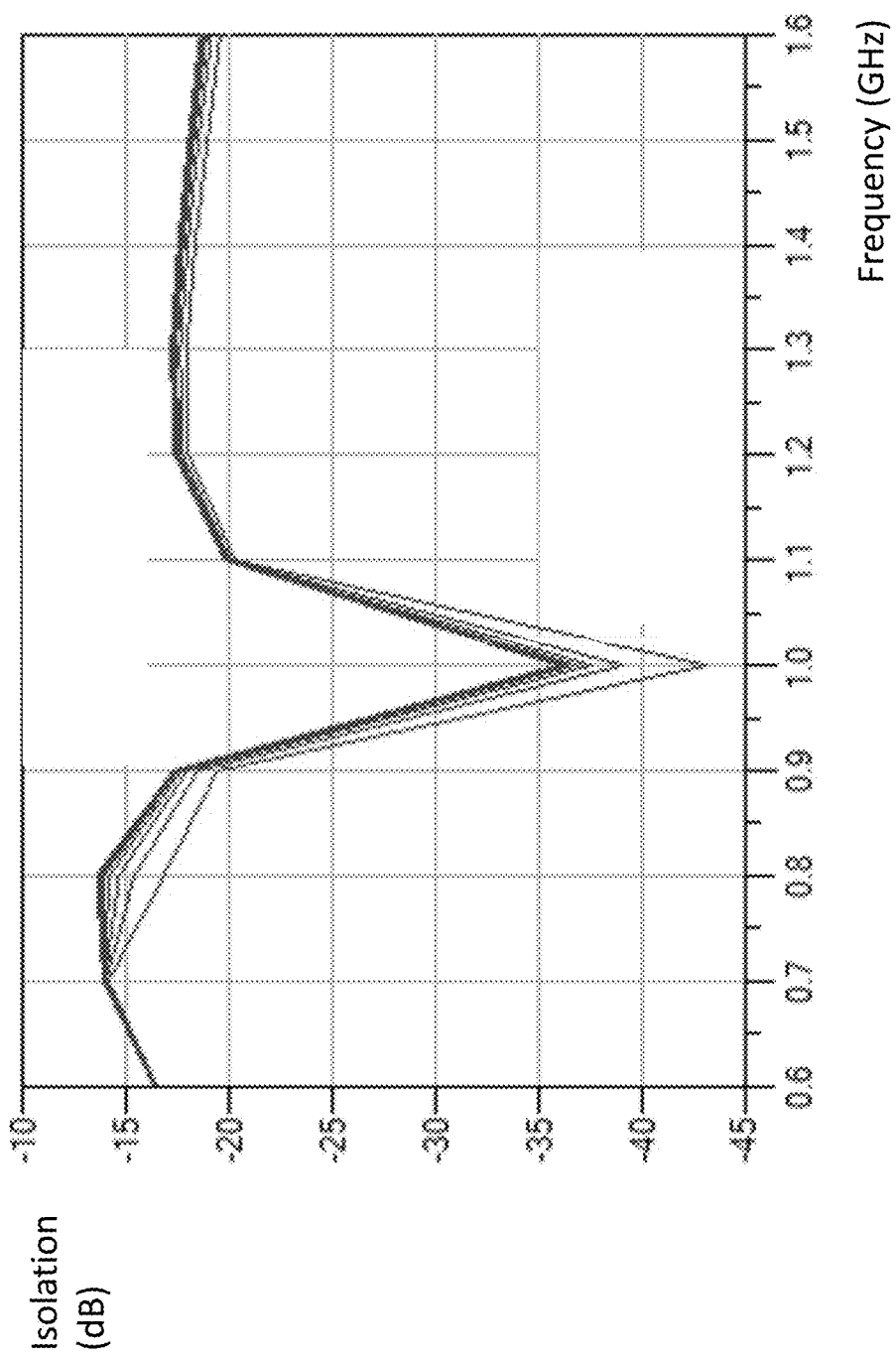
FIGS. 9A-9C show simulated results for a circulator with 1 GHz operation frequency and 5 to 25 dBm input power from a transmitter.
Figure 9B:
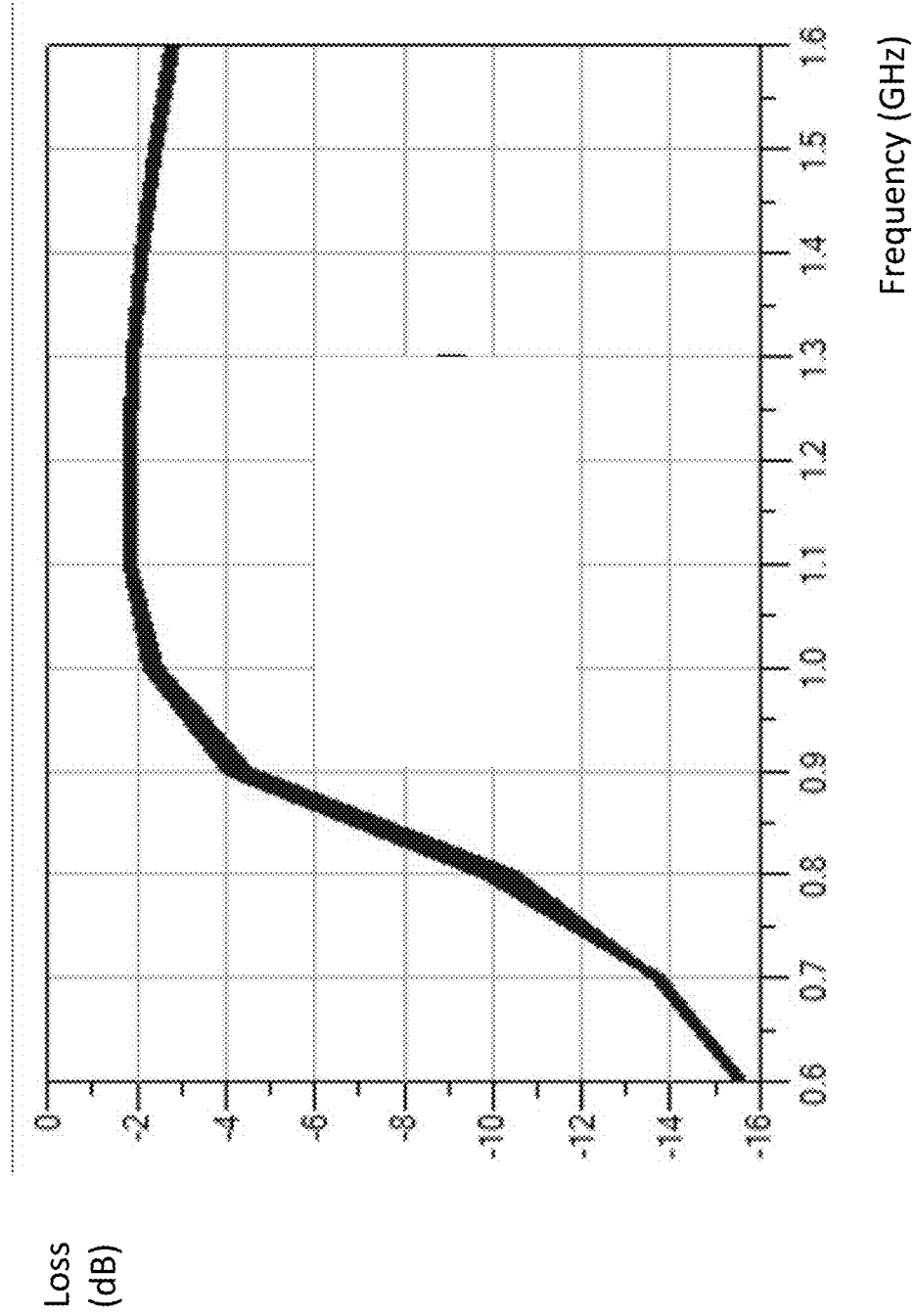
Figure 9C:
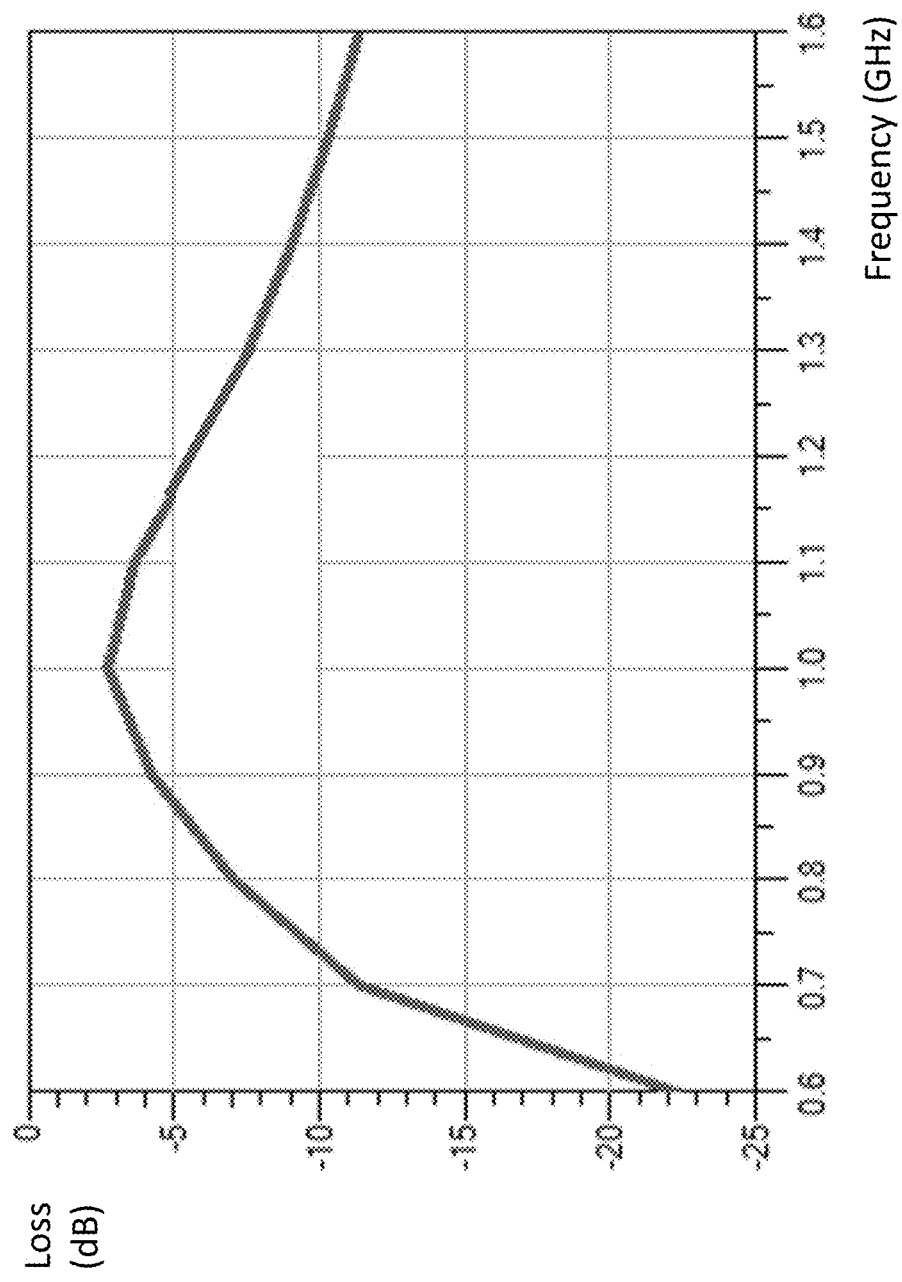

FIGS. 9A-9C show simulated results for the circulator 700 of FIG. 7 with 1 GHz operation frequency and 5 to 25 dBm input power from the transmitter Tx. To show maximum power handling of the circulator 700, the power of the transmitter Tx is swept from 5 to 25 dBm. As shown in FIG. 9B, the associated loss from the transmitter Tx to the antenna Ant shows constant around −2 dB up to 25 dBm. As shown in FIG. FIG. 9A, the isolation from the transmitter Tx to the receiver Rx also maintains very low below 35 dB at the 1.5 GHz center frequency. If the circulator 700 uses CMOS transistors instead of the GaN HEMTs, the input power may not be driven past 10 dBm. As shown in FIG. 9C, the loss from the antenna Ant to the receiver Rx may be lower than −2.5 dB and this may not be affected by high Tx power driving. The simulated results of FIGS. 9A-9C show that the circulator 700 comprising the non-reciprocal bandpass filter 600, 610 or 620 enables high power operation.

Although the example embodiments have been described in detail, it should be understood that various changes, substitutions and alterations can be made herein without departing from the spirit and scope of the application as defined by the appended claims.

Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding embodiments described herein may be utilized according to the embodiments and alternative embodiments. Accordingly, the appended claims are intended to include within their scope such processes, machines, manufacture, compositions of matter, means, methods, or steps.

What is claimed is:

1. A circuit for driving a switched transistor, the circuit comprising:
a level shifter comprising at least one transistor, the level shifter configured to convert an input pulse to a pulse having a greater voltage swing than the input pulse and shift a voltage level of the converted pulse; and
a pulse shaping filter coupled between the level shifter and the gate of the switched transistor, the pulse shaping filter configured to cancel an impedance of the switched transistor.

2. The circuit of claim 1, wherein the switched transistor is a GaN High Electron Mobility Transistor (HEMT).

3. The circuit of claim 1, wherein the at least one transistor is a GaN HEMT.

4. The circuit of claim 1, wherein the level shifter comprises:
an inverting circuit comprising a first transistor and a second transistor, the inverting circuit configured to convert the input pulse into a pulse having the greater voltage swing; and
a level shifting circuit configured to shift the voltage level of the converted pulse.

5. The circuit of claim 4, wherein:
the first transistor has a gate coupled to an input terminal receiving the input pulse and a drain coupled to a source and a gate of the second transistor, and
the second transistor has the gate and the source coupled to the drain of the first GaN HEMT and a drain coupled to a first voltage source.

6. The circuit of claim 4, wherein the level shifting circuit comprises:
a first capacitor coupled to an output of the inverting circuit;
a first resistor having a first end coupled between the capacitor and the pulse shaping filter; and
a second voltage source coupled to a second end of the first resistor.

7. The circuit of claim 1, wherein the level shifter further comprises at least one diode configured to clamp a voltage level of the level shifted pulse.

8. The circuit of claim 1, wherein the input pulse is generated by a CMOS circuit.

9. The circuit of claim 1, wherein a duty cycle of the input pulse is around 25%.

10. The circuit of claim 1, wherein the pulse shaping filter is tuned to resonate with an input impedance of the switched transistor so that an edge shape of the level shifted pulse is maintained on the gate of the switched transistor.

11. The circuit of claim 1, wherein the pulse shaping filter is configured to limit a Direct Current (DC) current into the gate of the switched transistor.

12. The circuit of claim 1, wherein the pulse shaping filter comprises:
a parallel circuit of a second capacitor and a second resistor coupled to the level shifter; and
a third resistor coupled between the parallel circuit and the gate of the switched transistor.

13. A multi-element switched filter, comprising:
a plurality of switched transistors; and
a plurality of the circuits of claim 1, each of the circuits coupled to a gate of a respective one of the switched transistors.

14. The multi-element switched filter of claim 13, wherein the switched transistors and the at least one transistor included in the circuits of claim 1 are GaN HEMTs.

15. The multi-element switched filter of claim 13, wherein the switched transistors are coupled in parallel with each other.

16. The multi-element switched filter of claim 13, further comprising a plurality of capacitors, each of the capacitors coupled to a respective one of the switched transistors.

17. The multi-element switched filter of claim 13, wherein the circuits are driven with time delay one by one.

18. The multi-element switched filter of claim 17, wherein the time delay is set T/N, where T is a period of the input pulse and N is the number of delay elements in the period T.

19. A multi-path bandpass filter, comprising:
a plurality of switched transistors;
a plurality of the pulse shaping filters of claim 1, each of the pulse shaping filters coupled to a gate of a respective one of the switched transistors; and a plurality of the level shifters of claim 1, each of the level shifters coupled to at least one of the pulse shaping filters.

20. The multi-path bandpass filter of claim 19, wherein the switched transistors and the at least one transistor included in the circuits of claim 1 are GaN HEMTs.

21. The multi-path bandpass filter of claim 19, wherein the each of the level shifters is coupled to at least two of the pulse shaping filters which have the same time delay of the input pulse.

22. The multi-path bandpass filter of claim 19, further comprising a plurality of shunt capacitors connected to at least one of the switched transistors.

23. The multi-path bandpass filter of claim 19, wherein the level shifters are driven with time delay one by one.

24. A circulator, comprising:
the multi-path bandpass filter of claim 19;
a transmitter;
a receiver;
an antenna; and
first, second and third phase transformers configured to provide phase shift,
wherein the first phase transformer is coupled between the transmitter and the antenna, the second phase transformer and the multi-path band pass filter are coupled between the transmitter and the receiver, and the third phase transformer is coupled between the antenna and the receiver.

25. The circulator of claim 24, wherein the multi-path bandpass filter is configured to provide a positive phase shift from the transmitter to the receiver and a negative phase shift from the receiver to the transmitter.

26. The circulator of claim 24, wherein at least one of the first, second and third phase transformers comprises:
two capacitors connected in series to each other; and
an inductor connected between the two capacitors.

27. A multi-path bandpass filter, comprising:
a plurality of switched transistors;
a plurality of the pulse shaping filters of claim 1, each of the pulse shaping filters coupled to a gate of a respective one of the switched transistors;
the level shifter of claim 1;
a plurality of delay circuits coupled to the level shifter, the delay circuits configured to time delay the level shifted pulse, each of the delay circuits coupled to one or more of the pulse shaping filters.

28. The multi-path bandpass filter of claim 27, wherein the switched transistors and the at least one transistor included in the level shifter of claim 1 are GaN HEMTs.

* * * * *